United States Patent

Chung et al.

[11] Patent Number: 5,504,030
[45] Date of Patent: Apr. 2, 1996

[54] PROCESS FOR FABRICATING HIGH-DENSITY MASK ROM DEVICES

[75] Inventors: Chen-Hui Chung, Hsinchu; Kuan-Cheng Su, Taipei; Yi-Chung Sheng, Taichung, all of Taiwan

[73] Assignee: United Microelectronics Corporation, Hsinchu, Taiwan

[21] Appl. No.: 505,050

[22] Filed: Jul. 21, 1995

[51] Int. Cl.$^6$ .............................................. H01L 21/8246
[52] U.S. Cl. ................... 437/52; 437/45; 437/48; 437/238
[58] Field of Search ................... 437/45, 48, 52, 437/238; 257/390, 391; 365/182

[56] References Cited

U.S. PATENT DOCUMENTS

| | | | |
|---|---|---|---|
| 4,200,474 | 4/1980 | Morris | 237/390 |
| 5,304,510 | 4/1994 | Suguro et al. | 437/240 |
| 5,436,185 | 7/1995 | Hsue et al. | 437/45 |

Primary Examiner—Tom Thomas
Attorney, Agent, or Firm—Ladas & Parry

[57] ABSTRACT

A method of fabricating memory cells of a mask ROM device. A plurality of source/drain regions extending along a first direction is formed by implanting impurities into a semiconductor substrate, constituting bit lines of the memory cells. A code oxide layer is formed on a designated area of the semiconductor substrate defined by a barrier layer using a liquid-phase deposition process, whereby a multi-state mask ROM is fabricated by repeatedly performing the liquid-phase deposition process to form a series of coding oxide layers having increasing thicknesses. A gate oxide layer is formed on a portion of the semiconductor substrate not covered by the coding oxide layers. The thickness of the gate oxide layer is smaller than that of the coding oxide layers. A plurality of gate electrodes extending along a second direction orthogonal to the first direction is formed by depositing and patterning a conducting layer on the coding oxide layer and the gate oxide layer, constituting word lines of said memory cells. The cross area of every two adjacent bit lines and one word line thereby forms a memory cell of the mask ROM wherein threshold voltages of the memory cells are altered proportional to the thicknesses of the gate oxide layer and the coding oxide layers.

9 Claims, 5 Drawing Sheets

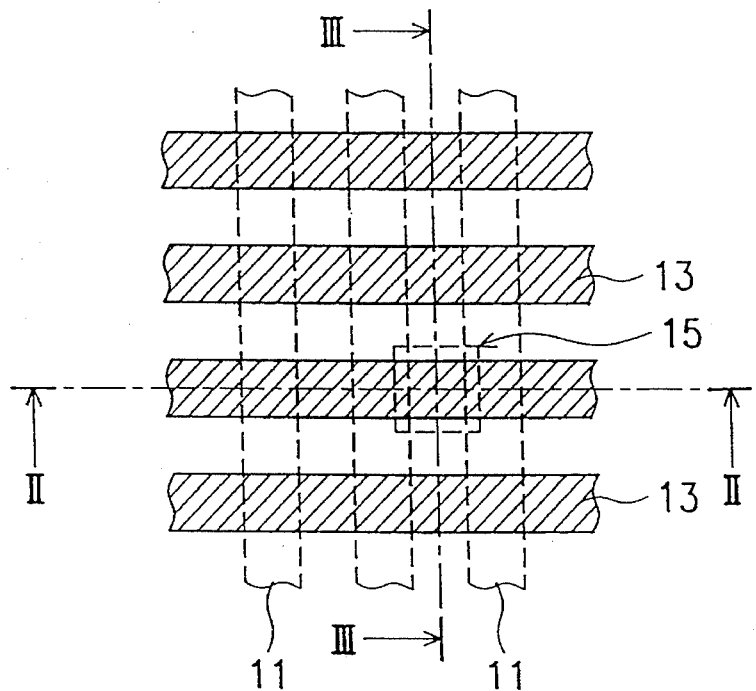
FIG. 1 (PRIOR ART)
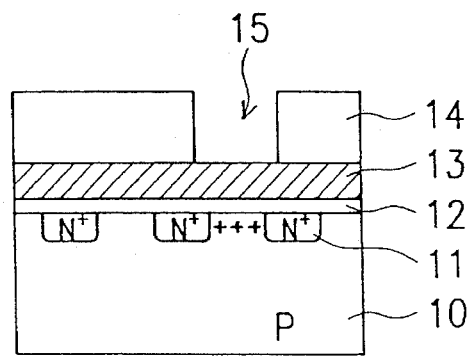 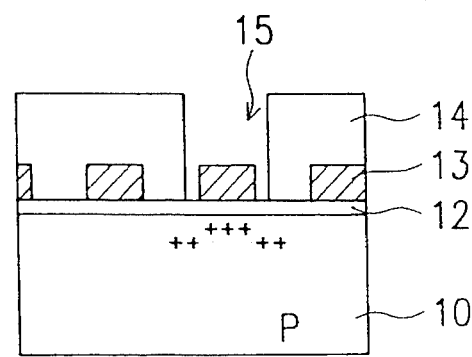
FIG. 2 (PRIOR ART)  FIG. 3 (PRIOR ART)

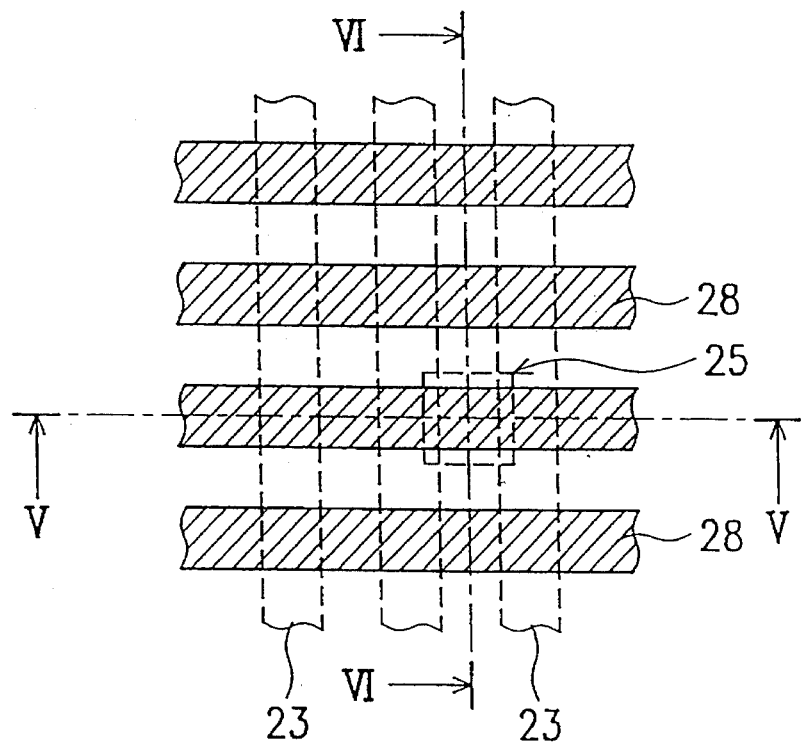
FIG. 4
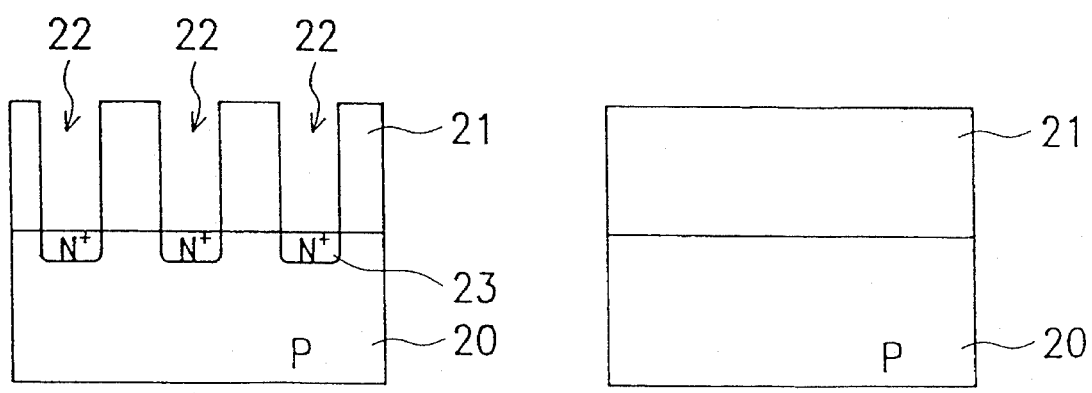
FIG. 5A
FIG. 6A

PROCESS FOR FABRICATING HIGH-DENSITY MASK ROM DEVICES

BACKGROUND OF THE INVENTION

1. Field of the Invention

The present invention relates in general to a process for semiconductor memory device fabrication. In particular, the present invention relates to a process for the fabrication of high-density read-only memory devices utilizing a liquid-phase deposition-coding oxide layer to improve process alignment and eliminate variations in device characteristics. More particularly, the present invention relates to a process for the fabrication of high-density read-only memory devices with improved process alignment and elimination of variations in device characteristics while providing for the storage of more than one bit of binary data within a single memory cell.

2. Technical Background

Semiconductor read-only memory (ROM) devices, in particular, masked ROM's, are enjoying the advantages brought about by miniaturization resulting from the continuing advancements in semiconductor technology. Among the most apparent advantages is an increase in memory storage capacity. More and more memory cells can be packed into the same semiconductor die area during commercial mass production of the ROM devices. Along with the process of device miniaturization, the architectural configuration of the mask ROM memory cell has undergone a series of changes, from the traditional two-state memory cell configurations to the x-cell, the flat cell, and, lately, the modified flat cell. These cell configuration improvements have propelled commercial mask ROM devices from the 128K, through 256K, and up to the 16M, even 32M-bit storage capacity levels. These ever increasing capacity mask ROM devices are being manufactured into integrated circuits having reasonable commercially feasible chip sizes.

Coding, that is, the programming of the memory contents of conventional mask ROM devices, is typically implemented by implanting impurities into the channel regions of the selected memory cell transistors of the mask ROM device. The goal is to set the threshold voltage in the channel regions of the memory cell transistors, so that the transistors may be "coded" or "programmed" into their conducting or blocking states, which may be interpreted by auxiliary circuitry of the mask ROM device to be either binary "0" or "1" data bits.

However, the technique of ion implantation to accomplish the mask ROM memory cell content coding reveals some phenomena that are disadvantageous for the miniaturization of mask ROM devices. In particular, the lateral diffusion phenomena of the implanted impurities, as well as the increased difficulties of alignment as the devices get smaller and the fabrication resolution gets finer, makes it more difficult to control the characteristics of the mask ROM devices fabricated.

Further, the use of single memory cells in the memory array of the ROM devices to store one bit of data is a limitation of current semiconductor storage systems. The use of a single memory cell for the storage of more than one bit of data, or the equivalent of more than one bit of binary data, will provide for the expansion of ROM device storage capacity within a semiconductor device of the same physical size.

A brief examination of the semiconductor structural configuration of the memory cell of a prior art mask ROM device will help to lay the foundation for the description of the present invention. FIGS. 1–3 of the accompanying drawing of the present invention depict the characteristics of the memory cell of a conventional mask ROM device when the coding thereof is concerned, wherein FIG. 1 is the top view, and FIGS. 2 and 3 are the cross-sectional views of the memory cell respectively as selected from the designated cross-sectional lines in FIG. 1.

As can be seen in the drawing, the memory cell of the conventional mask ROM device is fabricated over semiconductor silicon substrate 10 having been doped therein with P-type impurities. Source/drain regions 11 are formed by the implantation of N-type impurities into the designated regions on the substrate that extend along a designated direction in substrate 10 to form the bit lines for the memory array of the mask ROM device. Gate oxide layer 12 is then formed to cover substrate 10, with the formation of gate electrodes 13 that extend along a second direction over the surface of substrate 10. In general, the longitudinal directions of gate electrodes 13 will be orthogonal to the longitudinal directions of source/drain regions 11. Gate electrodes 13 also constitute the word lines for the memory array of the mask ROM device.

Every region of substrate 10, namely, the region confined between every two adjacent bit lines that is beneath the word line, constitutes the channel region for a memory cell transistor for the mask ROM memory array. The memory cell transistor will be made, or, coded either into its state of conduction or blocking, depending on the specific requirement that the cell should be storing either a binary 1 or 0 data bit. The correspondence of the status of channel region conductance and the bit value of stored data bit is dependent on the design of the device, as mentioned above. However, the key to the coding of the transistor for a particular cell to be in its blocking state, is to implant P-type impurities into the channel region of the selected memory cell transistor.

The presence of the implanted impurities via the code implant procedure allows the raising of the threshold voltage of that memory cell transistor channel region. This code implant procedure, in the case of the conventional mask ROM devices, may be done by applying photoresist layer 14 covering the surface of substrate 10, but with exposed coding openings 15 that allows for the ion implantation procedure to implant the required impurities with the designated concentration into the exposed channel regions of the selected memory cell transistors.

The coding procedure, namely, the ion implantation procedure, requires that the impurities be precisely implanted into the designated channel regions of the memory cell transistors as selected by coding openings 15 that are formed in photoresist layer 14. This means that the alignment of photoresist layer 14 over substrate 10 must be sufficiently precise, so that a coding opening reveals the channel region that is supposed to be between two consecutive bit lines and beneath one word line. As persons skilled in the art may well aware, as the size of the memory cells get ever smaller, and the fabrication resolution becomes finer, this task of precision alignment has becomes more and more difficult. On the other hand, the inherent phenomena of impurity lateral diffusion also requires that safety space be reserved for the periphery of the channel region, so that the most important characteristics of memory cell transistor conductance can be precisely controlled. These factors, however, create difficulties for device miniaturization.

SUMMARY OF THE INVENTION

It is therefore an object of the present invention to provide a process for fabricating mask ROM devices employing the technique of liquid-phase deposition that allows for the prevention of the impurity diffusion to alter the designed characteristics of the fabricated mask ROM device.

It is another object of the present invention to provide a process for fabricating mask ROM devices employing the technique of liquid-phase deposition that allows for the precision alignment of the fabrication process to retain the designed characteristics of the fabricated mask ROM device.

It is still another object of the present invention to provide a process for fabricating mask ROM devices employing the technique of liquid-phase deposition that allows for the storage of more than one bit of data within a single memory cell of the fabricated mask ROM device.

The present invention achieves the above-identified objects by providing a method of fabricating memory cells of a mask ROM device. First, a plurality of source/drain regions extending along a first direction is formed by implanting impurities into a semiconductor substrate to constitute a plurality of bit lines of the memory cells. Next, a coding procedure is performed by forming a code oxide layer on a designated area of the semiconductor substrate defined by a barrier layer using a liquid-phase deposition process. A multi-state mask ROM can be fabricated by repeatedly performing the liquid-phase deposition process to form a series of coding oxide layers having increasing thicknesses. Then, a gate oxide layer is formed on a portion of the semiconductor substrate not covered by the coding oxide layers. The thickness of the gate oxide layer is smaller than that of the coding oxide layers. Finally, a plurality of gate electrodes extending along a second direction orthogonal to the first direction is formed by depositing and patterning a conducting layer on the coding oxide layer and the gate oxide layer, so as to constitute a plurality of word lines of said memory cells. The cross area of every two adjacent bit lines and one word line thereby forms a memory cell of the mask ROM wherein threshold voltages of the memory cells are altered proportional to the thicknesses of the gate oxide layer and the coding oxide layers.

Other objects, features, and advantages of the present invention will become apparent by way of the following detailed description of the preferred but non-limiting embodiments.

BRIEF DESCRIPTION OF THE DRAWINGS

The detailed description of the preferred embodiments is made with reference to the accompanying drawings in which:

FIG. 1 schematically shows the top view of the memory cells of a conventional mask ROM device;

FIG. 2 is the cross-sectional view of the memory cells of the conventional mask ROM device of FIG. 1 taken along the II—II line therein;

FIG. 3 is the cross-sectional view of the memory cells of the conventional mask ROM device of FIG. 1 taken along the III—III line therein;

FIG. 4 schematically shows the top view of the memory cells of the mask ROM device fabricated in accordance with a preferred embodiment of the present invention;

FIGS. 5A–5D are cross-sectional views of the memory cells of the mask ROM device of FIG. 4 taken along the V—V line of FIG. 4 which are depicted from the subsequent process stages of fabrication;

FIGS. 6A–6D are cross-sectional views of the memory cells of the mask ROM device of FIG. 4 taken along the VI—VI line of FIG. 4 which are depicted from the corresponding process stages as outlined in FIGS. 5A–5D respectively.

DETAILED DESCRIPTION OF THE PREFERRED EMBODIMENTS

Figure 5B:
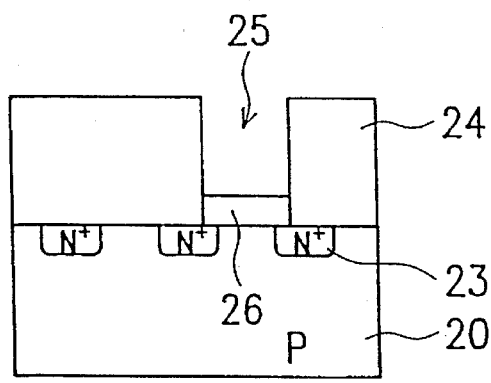

For a description of a preferred embodiment of the present invention, reference is directed to FIGS. 4, 5A–5D, and 6A–6D concurrently. FIGS. 4, 5 and 6 of the accompanying drawing of the present invention depict the characteristics of the memory cell of the mask ROM device fabricated in accordance with a preferred embodiment of the present invention, wherein FIG. 4 is the top view, and FIGS. 5A–5D and 6A–6D are the respective cross-sectional views of the memory cell as selected from the designated cross-sectional lines V—V and VI—VI in FIG. 4. FIGS. 5A–5D and 6A–6D are cross-sectional views depicted from the subsequent process stages of fabrication that characterizes the present invention.

As can be seen in the drawings, in particular, the top view in FIG. 4, as well as the cross-sectional views FIGS. 5A and 6A, depicts semiconductor substrate 20, such as a P-type silicon substrate. Photoresist layer 21 is coated on the surface of substrate 20 and patterned by conventional photolithography process to form multiple parallel strip-shaped openings 22. Openings 22 reveal the surfaces of substrate 20 that will form the source/drain regions for the memory cell transistors of the mask ROM device to be fabricated.

Photoresist layer 21, with its openings 22 defined by its particular patterns, may be utilized as a mask for the implementation of an ion implantation procedure to implant N-type impurities such as, for example, phosphoric ions into substrate 20. The implantation is effected in the revealed area of substrate 20 as defined by openings 22. This allows for the formation of the multiple of parallel N+ heavily-doped source/drain regions 23 for the memory cell transistors of the mask ROM device being fabricated, as is seen in the cross-sectional view of FIG. 5A. Source/drain regions 23 constitute the bit lines for the memory array of the mask ROM device.

Figure 6B:
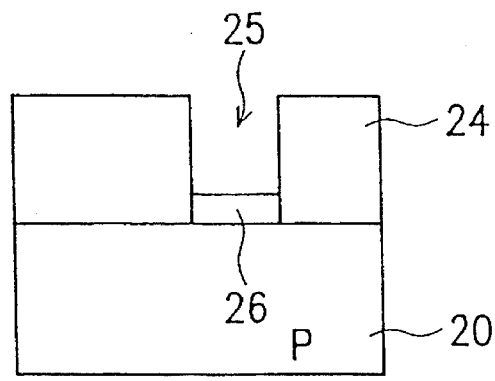

Next, referring to FIG. 4, as well as FIGS. 5B and 6B simultaneously, photoresist layer 21 may then be removed by, for example, applying suitable solvents as is known in the art, before second photoresist layer 24 may be coated on substrate 20. A photolithography process is utilized to define patterns of second photoresist layer 24, so that coding openings 25 are formed in photoresist layer 24. As is observed in the top view of FIG. 4, each of coding opening 25 is a generally square-shaped opening that reveals the portion of the surface areas of substrate 20. The revealed area bears the designation for a channel region that is each located between two consecutive bit lines.

Then, second photoresist layer 24 is utilized as a mask for the implementation of a liquid-phase deposition (LPD) procedure. This LPD procedure forms thick oxide layer 26 over the surface of substrate 20 as confined by coding opening 25. Due to the excellent deposition selectivity of the LPD process that allows the deposition formation of the oxide layer to occur only on the surface of the revealed silicon material, that is, the surface of substrate 20, with virtually no accumulation of the oxide layer on the surface of photoresist layer 24, it is therefore possible to precisely control the thickness of deposited oxide layer 26 by controlling the time allowed for the implementation of the LPD procedure.

Figure 5C:
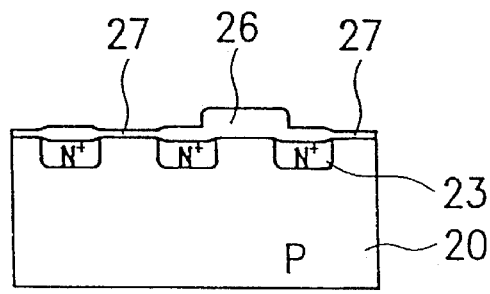
Figure 6C:
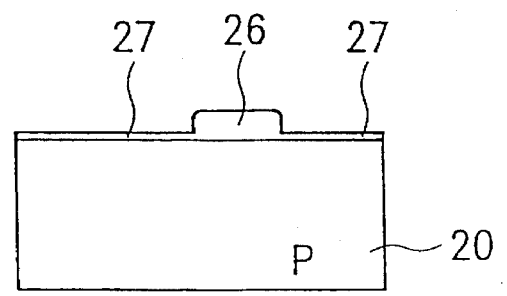

Then, referring to FIGS. 5C and 6C simultaneously with FIG. 4, second photoresist layer 24 may then be removed, with a suitable solvent known in the art. A thermal oxidation procedure may then be conducted to form oxide layer 27 in the areas of the surface of substrate 20 other than those of deposited oxide layer 26 formed in the previous LPD procedure. The thickness of oxide layer 27 is controlled to be less than that of deposited oxide layer 26.

Figure 5D:
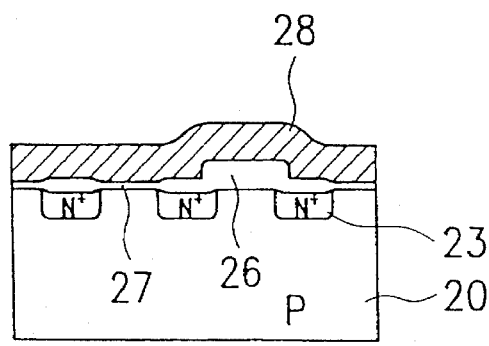
Figure 6D:
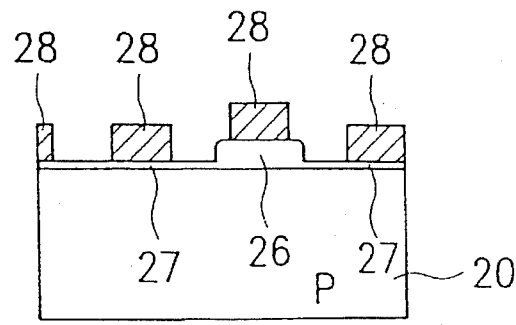

Next, reference is directed to FIGS. 5D and 6D, simultaneously with FIG. 4. A conducting layer is formed over the surface of both oxide layers 27 and 26. This can be achieved by the implementation of a procedure that deposits a layer of polysilicon or polycide. After the deposition formation of this electrically conducting layer, conventional photolithography and etching procedures may then be conducted to form a plurality of gate electrodes 28 that constitute the word lines for the memory array of the mask ROM device. As may be observed in the top view of FIG. 4, gate electrodes 28, are a multiple of generally parallel strip-shaped configurations that extend along a direction generally orthogonal to the longitudinal direction of source/drain regions 23 that constitute the bit lines.

As is seen in the cross-sectional views of FIGS. 5D and 6D, oxide layer 26, which was formed in the LPD procedure to cover the region of the surface of substrate 20 designated as one of the channel regions of the memory cell transistors in the memory array of the mask ROM device to be coded, has a greater thickness than any other region of oxide layer 27, including all other channel regions of the memory cell transistors not to be coded. This greater oxide layer thickness in the coded channel region of a memory cell transistor raises the threshold voltage of that particular channel region over those not having increased oxide layer thickness as coded.

In other words, those memory cell transistors having thick oxide layer 26 as coded may by programmed to be in their blocking state under normal mask ROM device operation conditions. All other memory cell transistors having normal oxide layer 27 may remain uncoded and retain their conduction state under normal conditions of operation. Thus, the LPD coding of the memory cell transistor channel region allows achievement of the mask ROM memory content programming.

For a second preferred embodiment of the present invention, please refer to FIGS. 7A–7F of the drawing. This preferred embodiment further shows the usefulness of the process of the present invention for fabricating mask ROM devices that allow the implementation of multi-state memory cells.

Figure 7A:
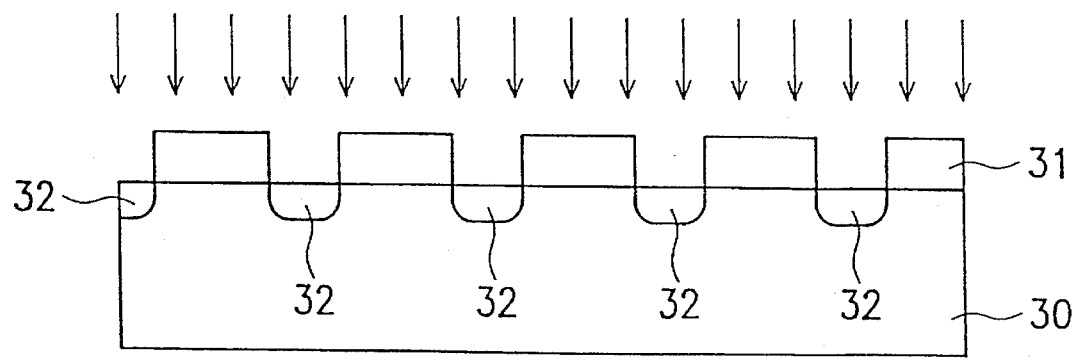
FIGS. 7A–7F are cross-sectional views of the memory cells of the mask ROM device as depicted from the process stages of fabrication in accordance with another preferred embodiment of the present invention that allows for the storage of more than one data bit of information within one single memory cell.

As is seen in FIG. 7A, photoresist 31 is coated on a semiconductor silicon substrate 30. Photoresist layer 31 is defined by a conventional photolithography process to form the required pattern that allows for the formation of the multiple of parallel source/drain regions 32 that constitute the bit lines for the memory array in the mask ROM device. This is achieved by employing photoresist layer 31 as a mask for the implementation of a ion implantation procedure that implants impurities such as, for example, phosphoric ions into the regions of substrate 30 as defined by the pattern of photoresist layer 31. As is readily apparent this procedure is similar to that described in the first preferred embodiment of the present invention.

Figure 7B:
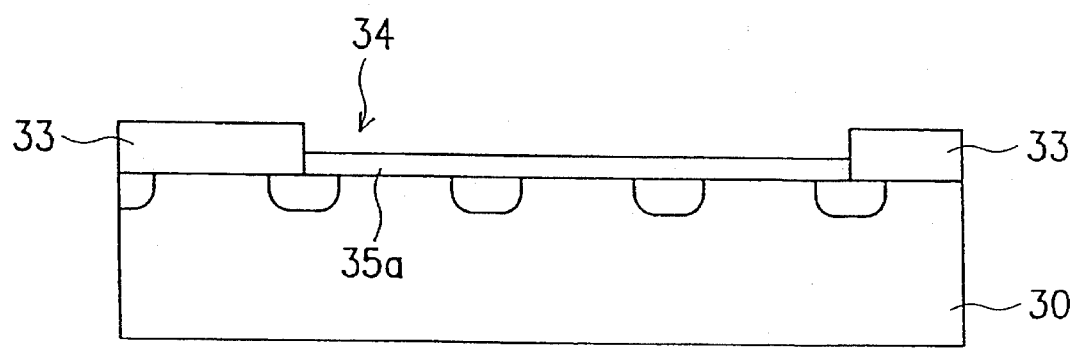

Next, referring to FIG. 7B, first photoresist layer 31 may then be removed by an appropriate solvent, and second photoresist layer 33 is coated. Second photoresist layer 33 is processed to acquire the desired patterns therein, containing coding opening 34 of the first level. As was in the case of the first embodiment, photoresist layer 33 is employed as a mask for the implementation of a LPD procedure that deposits oxide layer 35a within coding opening 34. The thickness of oxide layer 35a may be in the range of, for example, 200 Å. After the formation of this first level of coding oxide layer 35a, second photoresist layer 33 may be removed.

Figure 7C:
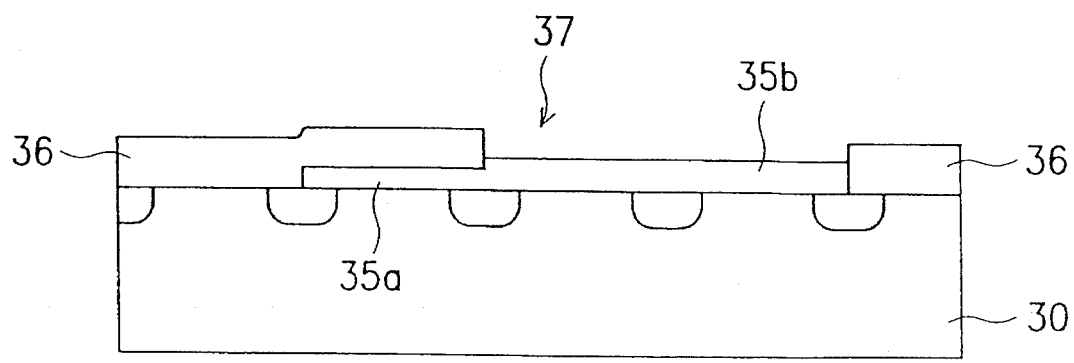

Next, in the process stage of FIG. 7C, third photoresist layer 36 may then be coated and patterned to form coding opening 37 of the second level. Third photoresist layer 36 may be utilized as a mask for the implementation of a second level of LPD procedure that deposits a second layer of oxide with a thickness of about, for example, another 200 Å in the spaces defined by coding openings 37 of the second level. In those coding openings already having deposited therein the first level of oxide layer 35a, the second deposition of the oxide layer of about 200 Å would allow the total deposition in that particular coding opening 37 to accumulate to oxide layer 35b of about 400 Å. On the other hand, in coding openings 37 not already having oxide layer 35a as deposited in the first coding deposition procedure described above, the thickness of the oxide layer will be about 200 Å. Naturally, in those channel regions for the transistor memory cells not designated for the coding, there is an accumulation of zero thickness oxide layer. Just as in the previous stage, third photoresist layer 36 may now be removed, after the conclusion of this second level of coding deposition of the oxide layer.

Figure 7D:
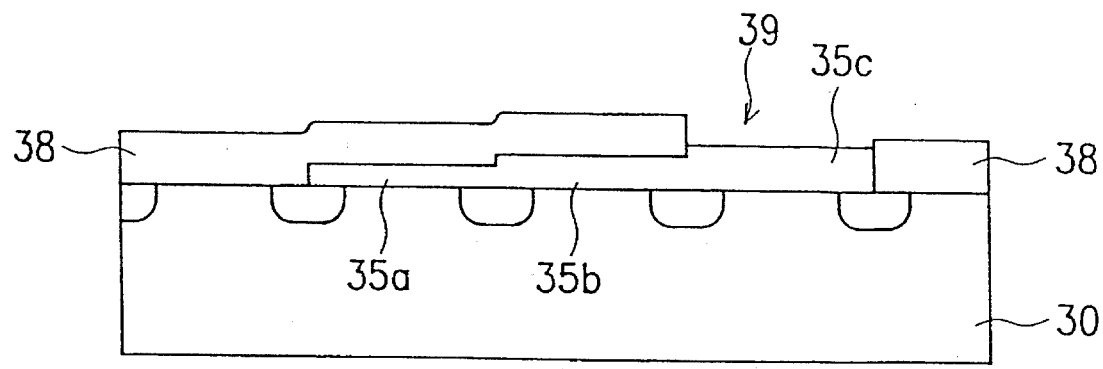

Then, as can be seen in FIG. 7D, fourth photoresist layer 38 may be coated, with its designated patterns of coding opening 39 of the third level contained therein. In a similar LPD procedure, fourth photoresist layer 38 is utilized as a mask for the implementation of a third level of LPD procedure that deposits another layer of oxides with a thickness of about, for example, another 200 Å, into the third level of coding openings 39. In a similar situation, those third level coding openings 39 already having deposited therein previous oxide layers 35a and 35b with the thickness of 200 Å and 400 Å respectively, may now be accumulated to the thickness of 400 Å and 600 Å, that is, oxide layers 35b and 35c respectively. And, those third level coding openings 39 not having deposited therein any oxide layers in the previous two levels of LPD coding procedures, may now have deposited therein oxide layer 35a of about 200 Å. On the other hand, of course, all those channel regions for the memory cell transistors not intended for the coding may still maintain their intact status.

Thus, up to this stage, the memory cells may now acquire the oxide layers with thicknesses of either 0, 200, 400 or 600 Å. Further LPD deposition procedures may be conducted to add to the level of oxide layer deposition, if required. In this exemplified embodiment of three LPD procedures, the four possible oxide layer thicknesses accumulated in each of the channel regions of the memory cell transistors allow each of the memory cells to exhibit a threshold voltage of one of four distinguishable levels. This is an equivalent of two data bits in one memory cell of the mask ROM device.

Figure 7E:
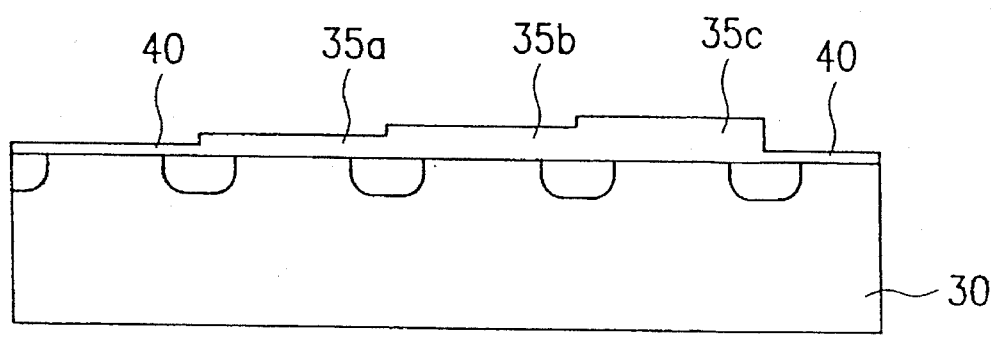

Referring to FIG. 7E, fourth photoresist layer 38 may now be removed. A thermal oxidation procedure may then follow to form additional relatively thinner oxide layer 40 of about, for example, 150 Å in thickness. Thin oxide layer 40, together with oxide layers 35a, 35b, or 35c, form the gate oxide layers for the memory cells of the mask ROM device. Typically, the thicknesses of gate oxide layers 40, 35a, 35b, and 35c are in a relationship of an increasing series. For example, possible thicknesses of these formed gate oxide layers would then be, respectively, 150, 280, 470 and 660 Å.

Figure 7F:
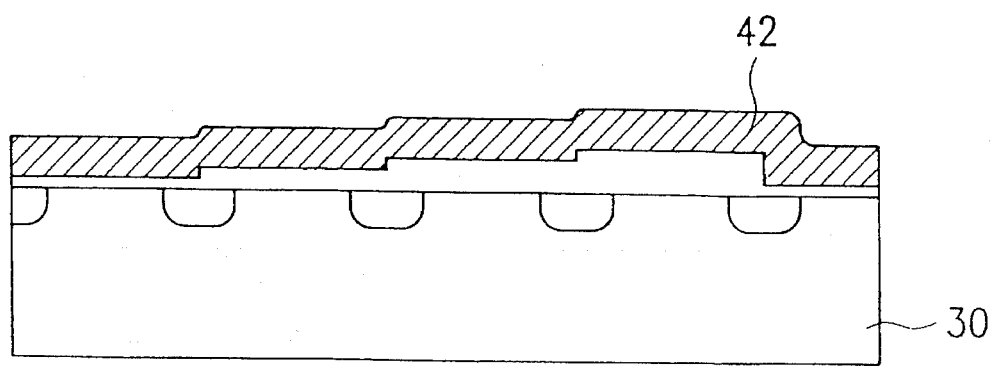

Finally, in FIG. 7F, a further procedure is then conducted to deposit a layer of conducting layer of, for example, polysilicon or polycide that covers the layers previously formed. Then, as was in the case of the first embodiment, another photolithography procedure would then be employed to form the multiple of parallel gate electrodes 42, which constitute the word lines for the memory cells of the mask ROM device.

As is appreciated by persons skilled in the art, the completion of the formation of gate electrodes 42 concludes the formation of the memory cells of the mask ROM device. With the channel regions accumulating their respective oxide layers of controlled thickness, the entire mask ROM device may now have a memory array coded with the required code content. In the exemplified preferred embodiment, each of the memory cells is capable of storing the equivalent of a two-bit data, virtually doubling the memory capacity within the same semiconductor die area.

In this second embodiment of the present invention, the four possible oxide layer thicknesses of 150, 280, 470 and 660 Å achievable for the gate electrodes of each of the memory cells would represent the threshold voltage of about 0.94, 1.77, 2.92 and 4.13 V respectively. With the proper design in the auxiliary circuitry that normally accompany the memory array in a mask ROM device, the sense amplifiers of the auxiliary circuitry may be designed to be able to distinguish among these threshold voltage levels. With this capability, the auxiliary circuitry would be able to access the double-bit equivalent memory cells of the mask ROM device thus fabricated. Naturally, as is appreciable, more levels of threshold voltages can be coded into the memory cells of the device, if required.

Thus, with the multi-level coding of the memory cells of the present invention, several advantages are apparent. First of all, since no ion implantation procedure is involved in the coding for the memory content of the mask ROM device being fabricated, it is readily apparent that the impurity diffusion problem inherent in the prior art mask ROM fabrication process is eliminated. This helps to gain the benefits of miniaturization of the mask ROM device being fabricated. Secondly, since the memory cell coding procedures involved in the process of the present invention are performed in a basically flat substrate, therefore, alignment control is relatively easy and cell size can push to lithography limit easily. In other words, it is easier to maintain precision of alignment in the fabrication process steps. This further implies an advantage for device miniaturization. Further, the formation of thick oxide layers helps to keep the capacitance of the blocking-state memory cells low, which is an advantageous factor for high speed device operation. And, the LPD procedure as employed in the process of the present invention is characterized by its ease of control over the thickness of the deposited oxide layer, which means the threshold voltage of the channel regions for the memory cell transistor can be precisely controlled. The capability of precise control over the threshold voltage of the transistor channel regions implies that the distinguishable threshold voltages can be distinguished on a finer scale. This also implies that more coding levels may be implemented into one single memory cell of the mask ROM device. More coding levels, by itself, implies more memory storage capacility allowed within the same physical space.

Thus, the process of fabricating mask ROM devices as disclosed by the present invention is advantageous for the fabrication of high density mask ROM devices with easier process control conditions. Although specific embodiments are exemplified in the descriptive paragraphs outlined above, persons skilled in the art can appreciate the fact that most of the modifications to the embodiments as disclosed should still be considered to be within the scope of the present invention, which is recited in the claimed scope that follows.

What is claimed is:

1. A method for fabricating memory cells of a mask ROM device, comprising the steps of:

forming a plurality of source/drain regions extending along a first direction by implanting impurities into a semiconductor substrate, said source/drain regions constituting bit lines of said memory cells;

forming a barrier layer on said semiconductor substrate and patterning said barrier layer to form coding openings exposing areas of said semiconductor substrate between said bit lines;

forming a coding oxide layer within said coding openings using a liquid-phase deposition process;

removing said barrier layer;

forming a gate oxide layer on a portion of said semiconductor substrate not covered by said coding oxide layer, said gate oxide layer having a thickness smaller than that of said coding oxide layer; and forming a conducting layer on said coding oxide layer and said gate oxide layer and patterning said conducting layer to form a plurality of gate electrodes extending along a second direction orthogonal to said first direction, said gate electrodes forming word lines of said memory cells, wherein a cross area of every two adjacent bit lines and one word line forms a memory cell of said mask ROM, the memory cell with said coding oxide layer having a threshold voltage larger than that of the memory cell without said coding oxide layer.

2. The method of fabricating memory cells of a mask ROM device according to claim 1, wherein the step of forming a barrier layer includes the step of forming a layer of photoresist on said semiconductor substrate and patterning said layer of photoresist to form coding openings exposing areas of said semiconductor substrate between said bit lines.

3. The method of fabricating memory cells of a mask ROM device according to claim 1, wherein the step of forming a conducting layer includes the step of forming a layer of polysilicon on said coding oxide layer and said gate oxide layer and patterning said layer of polysilicon to form said plurality of gate electrodes.

4. The method of fabricating memory cells of a mask ROM device according to claim 1, wherein the step of forming a conducting layer includes the step of forming a layer of polycide on said coding oxide layer and said gate oxide layer and patterning said layer of polycide to form said plurality of gate electrodes.

5. A method of fabricating memory cells of a mask ROM device, comprising the steps of:

forming a plurality of source/drain regions extending along a first direction by implanting impurities into a semiconductor substrate, said source/drain regions constituting bit lines of said memory cells;

performing a plurality of liquid-phase deposition processes to form coding oxide layers with different thicknesses on designated areas of said semiconductor substrate defined by a series of barrier layers;

forming a gate oxide layer with a thickness smaller than that of said coding oxide layers on a portion of said semiconductor substrate not covered by said coding oxide layers, wherein the thicknesses of said gate oxide and said coding oxide layers are in a relationship of an increasing series; and forming a conducting layer on said coding oxide layers and said gate oxide layer and patterning said conducting layer to form a plurality of gate electrodes extending along a second direction orthogonal to said first direction, said gate electrodes forming word lines of said memory cells, wherein a cross area of every two adjacent bit lines and one word line forms a memory cell of said mask ROM, said memory cell having threshold voltages of are altered to a degree proportional to the thicknesses of said gate oxide layer and said coding oxide layers.

6. The method of fabricating memory cells of a mask ROM device according to claim 5, wherein the step of performing a plurality of liquid-phase deposition processes includes the step of performing the liquid-phase deposition processes three times to form three coding oxide layers with three different thicknesses, forming a 4-state mask ROM device.

7. The method of fabricating memory cells of a mask ROM device according to claim 5, wherein the step of performing a plurality of liquid-phase deposition processes includes the step of using layers of photoresist as masks to form said coding oxide layers.

8. The method of fabricating memory cells of a mask ROM device according to claim 5, wherein the step of forming a conducting layer includes the step of forming a layer of polysilicon on said coding oxide layer and said gate oxide layer and patterning said layer of polysilicon to form said plurality of gate electrodes.

9. The method of fabricating memory cells of a mask ROM device according to claim 5, wherein the step of forming a conducting layer includes the step of forming a layer of polycide on said coding oxide layer and said gate oxide layer and patterning said layer of polycide to form said plurality of gate electrodes.

* * * * *